US012349431B2

(12) United States Patent
Ishibashi et al.

(10) Patent No.: US 12,349,431 B2
(45) Date of Patent: Jul. 1, 2025

(54) SEMICONDUCTOR DEVICE AND POWER CONVERSION APPARATUS

(71) Applicant: Mitsubishi Electric Corporation, Tokyo (JP)

(72) Inventors: Kazuya Ishibashi, Tokyo (JP); Katsutoshi Sugawara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 445 days.

(21) Appl. No.: 18/051,432

(22) Filed: Oct. 31, 2022

(65) Prior Publication Data
US 2023/0231017 A1    Jul. 20, 2023

(30) Foreign Application Priority Data

Jan. 19, 2022   (JP) ................... 2022-006132

(51) Int. Cl.
*H10D 62/83* (2025.01)
*H10D 62/10* (2025.01)
(Continued)

(52) U.S. Cl.
CPC ....... *H10D 62/8325* (2025.01); *H10D 62/127* (2025.01); *H10D 84/143* (2025.01)

(58) Field of Classification Search
CPC .. H10D 84/0193; H10D 84/853; H10D 84/85; H10D 30/6728; H10D 30/6733; H10D 30/6735; H10D 62/118; H10D 89/931; H10D 64/252; H10D 84/0188; H10D 84/201; H10D 18/60; H10D 62/8325; H10D 30/64–669; H10D 30/028–0297; H10D 62/152–155; H10D 62/156–159; H10D 30/62–6219; H10D 30/024–0245; H10D 84/0158; H10D 86/011; H10D 84/834; H10D 86/215; H10D 10/00–891; H10D 84/0112; H10D 84/0107–0109; H10D 89/711–713; H10D 84/401; H10D 84/611–619; H10D 84/403–409;
(Continued)

(56) References Cited

U.S. PATENT DOCUMENTS

2015/0263000 A1* 9/2015 Kono ..................... H10D 1/692
257/300

FOREIGN PATENT DOCUMENTS

JP          2013-232574 A     11/2013

* cited by examiner

*Primary Examiner* — Moin M Rahman
(74) *Attorney, Agent, or Firm* — Studebaker Brackett PLLC

(57) ABSTRACT

A semiconductor device has a cell region, a dividing region dividing the cell region in an expanding direction of a stacking fault band, and a termination region, and includes in a dividing region, a semiconductor layer including a drift region of a first conductivity type and a second well region of a second conductivity type provided in an upper portion of the drift region, a second interlayer insulating film provided on the semiconductor layer, and a source electrode provided on the second interlayer insulating film. The second interlayer insulating film has two second contact holes aligned in an expanding direction of stacking fault band and electrically connecting the source electrode to the second well region. The second well region is formed as one region continuous in the expanding direction of stacking fault band in the region interposed between the two second contact holes in top view.

13 Claims, 18 Drawing Sheets

(51) Int. Cl.
*H10D 62/832* (2025.01)
*H10D 84/00* (2025.01)

(58) Field of Classification Search
CPC ...... H10D 84/645; H10D 84/67; H10D 84/63;
H10D 84/641–643; H10D 84/673; H10D
84/901; H10D 84/996; H10D
62/133–136; H10D 62/137–138; H10D
62/177–184; H10D 64/231; H10D
64/281; H01L 21/76224; H01L 21/02167;
H01L 21/02378; H01L 21/02447; H01L
21/02529; H01L 21/0445–0495; H02K
15/027; A23B 2/783; A45C 11/003;
A61K 40/4218; H10F 77/955; H10F
39/197; H10H 20/826; B82Y 10/00;
C23C 16/325; C01B 32/956–984; H10B
12/36; H10B 12/056; H10B 12/10; H10B
20/10; H10B 10/10; H10B 69/00
See application file for complete search history.

F I G. 1 5
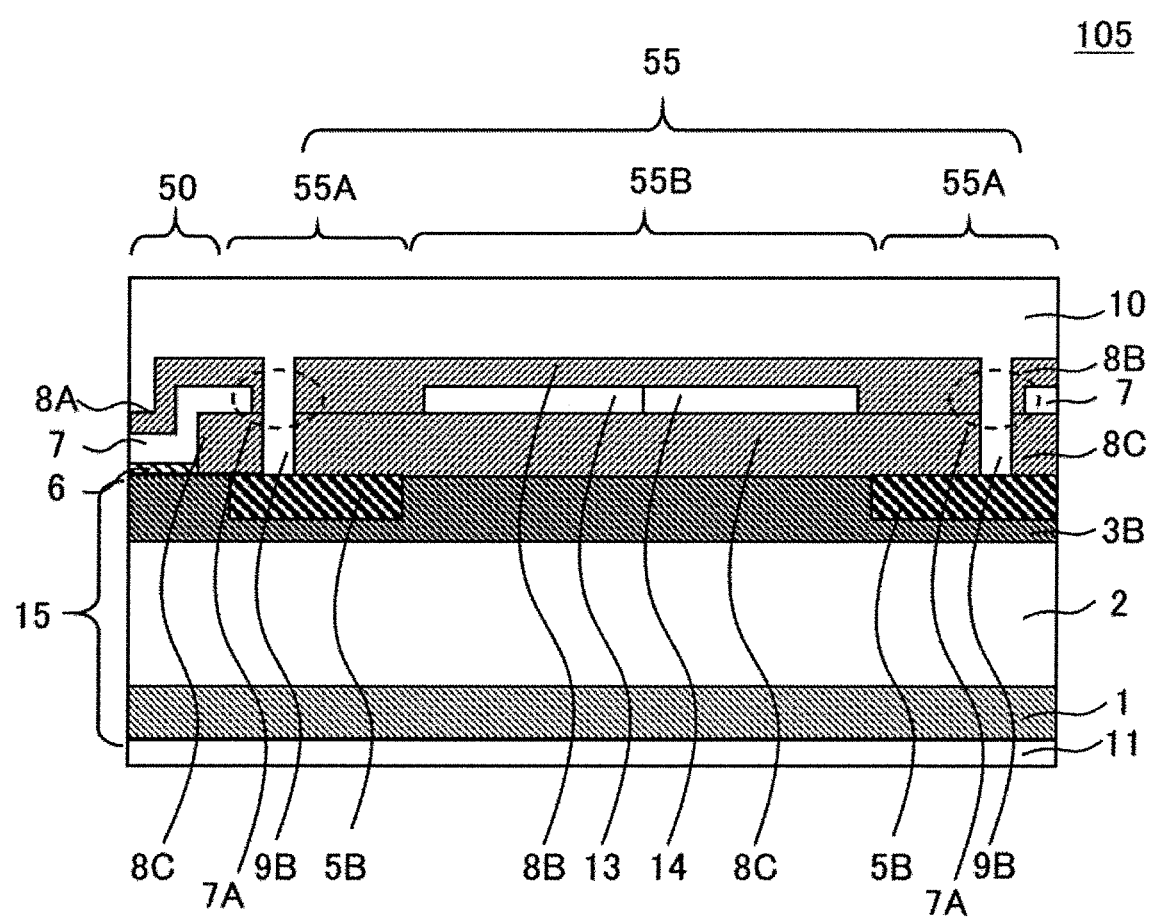

F I G. 1 8
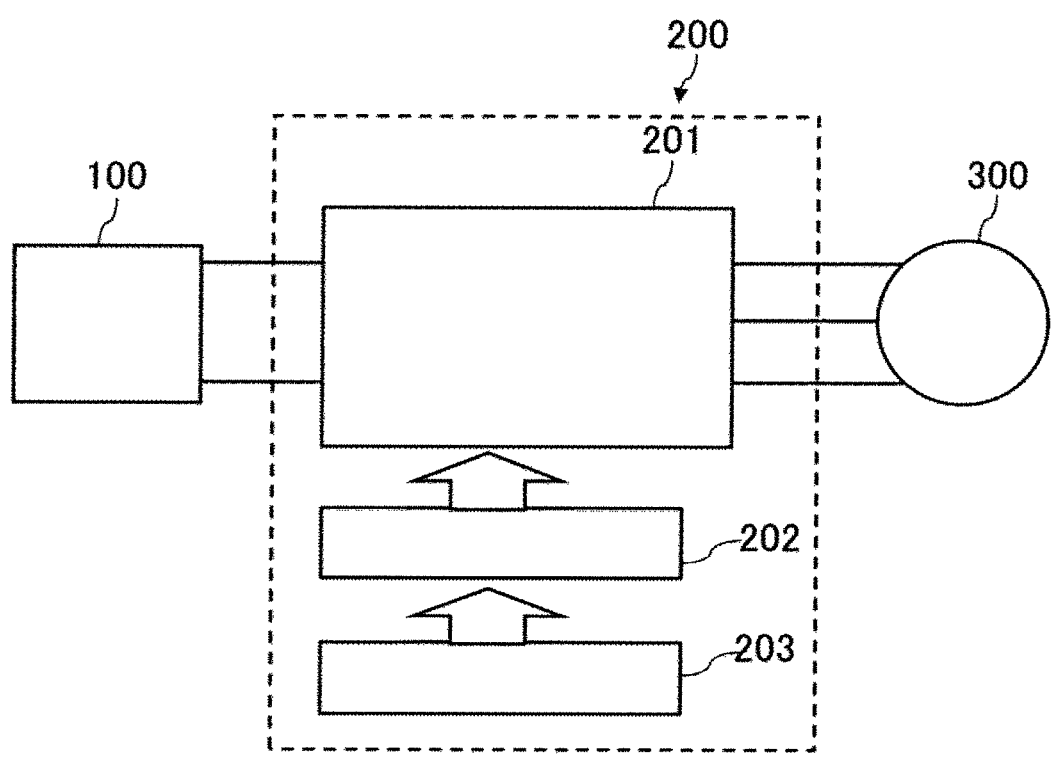

SEMICONDUCTOR DEVICE AND POWER CONVERSION APPARATUS

BACKGROUND OF THE INVENTION

Field of the Invention

The present disclosure relates to a semiconductor device.

Description of the Background Art

The use of a body diode structurally built into a Metal-Oxide-Semiconductor Field-Effect-Transistor (MOSFET) eliminates the requirement of an external diode necessary for freewheeling, leading to the significant downsizing of the system. In recent years, therefore, there is a rising demand for the use of this body diode as a freewheeling diode for this reason.

Meanwhile, when a forward current flows through the body diode of a MOSFET using SiC as its semiconductor material, the recombination energy generated by majority carriers and minority carriers expands a basal plane dislocations existing in the SiC crystal to expand a stacking fault band. This generates a portion in a cell region of the device where a current flow is hampered, increasing the On-resistance of the device.

Therefore, the development of techniques for suppressing the expansion of stacking fault band is being underway. For example, in Japanese Patent Application Laid-Open No. 2013-232574, a structure is adopted in which, in a region laying between well regions of a second conductivity type forming a transistor formed separately from each other on the surface of an epitaxial layer of a first conductivity type, a current limiting region made of an epitaxial layer of the first conductivity type is provided, thereby suppressing the expansion of stacking fault band. Further, well regions of the second conductivity type are formed at the right and left end portions of the surface of the epitaxial layer of the current limiting region in order to alleviate electric field concentration at the corners of the well regions of the second conductivity type that constitutes the transistor.

According to the semiconductor device of Japanese Patent Application Laid-Open No. 2013-232574, the well regions are formed at the right and left end portions of the surface of the epitaxial layer of the current limiting region to alleviate the electric field concentration at the corners of the well regions, thereby suppressing the expansion of stacking fault band. On the other hand, there has been a problem that, in a case where the width of the current limiting region is widened to further suppress the expansion of stacking fault band, a distance between the well regions also becomes longer, causing electric field concentration at the corners of the well regions within the current limiting region, which reduces the breakdown voltage markedly.

SUMMARY

The present disclosure has been made to solve the above-described problem, and an object thereof is to provide a semiconductor device capable of suppressing expansion of stacking fault band while suppressing a reduction in breakdown voltage.

According to the present disclosure, the semiconductor device using a semiconductor material having a wider bandgap than that of silicon for a main current path has a cell region conducting a main current, a dividing region dividing the cell region in an expanding direction of a stacking fault band, and a termination region provided around the cell region, which includes a semiconductor layer including a drain region of a first conductivity type, a drift region of the first conductivity type arranged on the drain region and having a lower impurity concentration than that of the drain region, a first well region of a second conductivity type arranged in the cell region and provided in an upper portion of the drift region, a second well region of the second conductivity type arranged in the dividing region and provided on the drift region, a source region of the first conductivity type arranged in the cell region and provided in an upper portion of the first well region, and a first well contact region of a second conductivity type, arranged in the cell region, provided in a portion of the upper portion of the first well region and adjacent to the source region, and having a higher impurity concentration than that of the first well region, a gate electrode arranged in the cell region and provided so as to be opposite to the first well region via a gate insulating film, an interlayer insulating film provided with a first contact hole in the cell region, provided with two second contact holes in the dividing region, and covering the gate electrode and the semiconductor layer, a source electrode provided on the interlayer insulating film and electrically connecting to the source region and the first well contact region via the first contact hole, and electrically connecting to the second well region via the two second contact holes, and a drain electrode arranged on the drain region on an opposite side to the drift region, in which the two second contact holes are aligned in the expanding direction of the stacking fault band, and the second well region is formed as one region continuous in the expanding direction of the stacking fault band in a region interposed between the two second contact holes in top view.

According to the present disclosure, suppressing expansion of stacking fault band is ensured while suppressing a reduction in breakdown voltage.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 15 is a cross-sectional view illustrating a schematic configuration of a semiconductor device according to a fifth embodiment;

FIG. 18 is a block diagram illustrating a configuration a power conversion system to which a power conversion apparatus according to a sixth embodiment is applied.

DESCRIPTION OF THE PREFERRED EMBODIMENTS

First Embodiment

The semiconductor device 101 according to a first embodiment will be described with reference to FIGS. 1 to 7.

Figure 1:
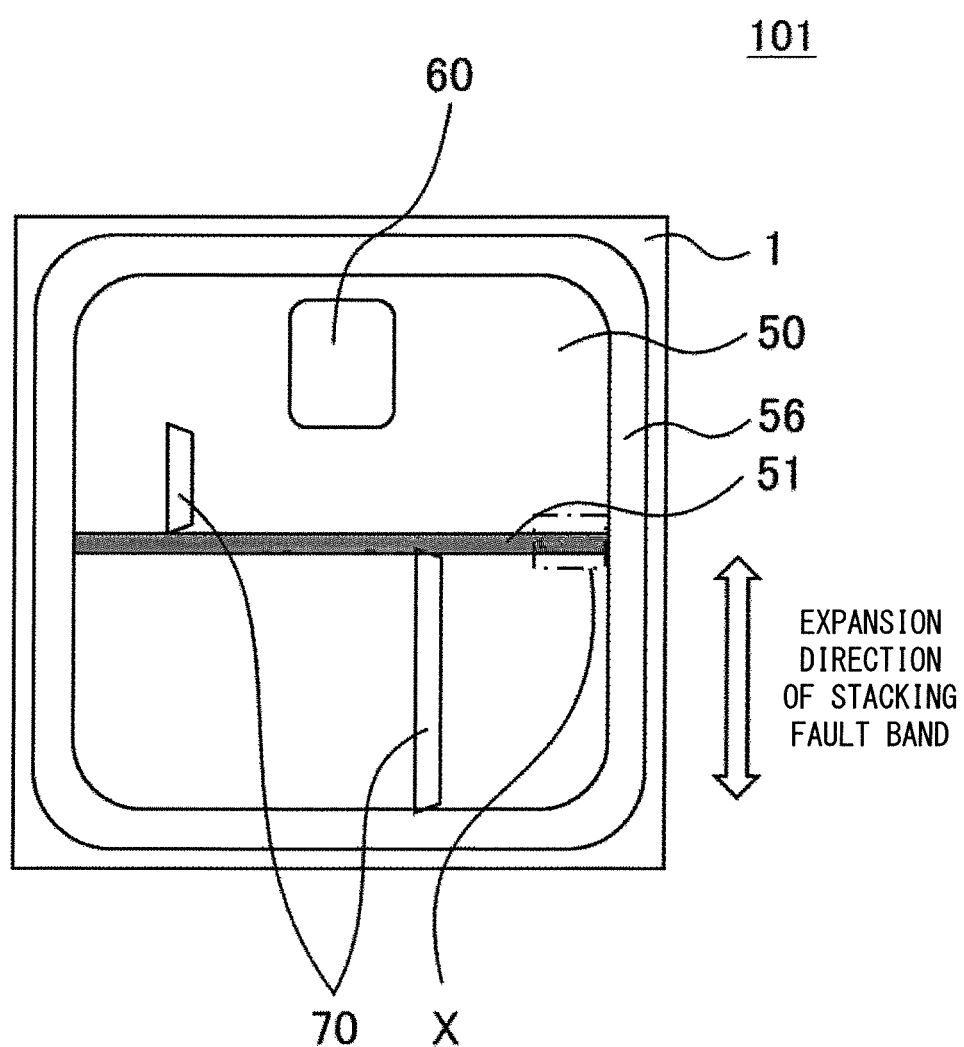
FIG. 1 is a plan view illustrating a schematic configuration of a semiconductor device according to a first embodiment.

FIG. 1 is a plan view illustrating a main surface of the semiconductor device 101 in top view. A MOSFET is illustrated as the semiconductor device 101. As illustrated in FIG. 1, the semiconductor device 101 includes a termination region 56 that holds a breakdown voltage in a semiconductor substrate, a cell region 50 that is surrounded by the termination region 56 and conducts a main current, and a dividing region 51 that divides the cell region 50 in an expanding direction of stacking fault band 70. A gate pad 60 electrically connected to a gate electrode of the MOSFET is provided within the cell region 50. A source pad (not illustrated) electrically connected to a source electrode of the MOSFET is provided in the two cell regions 50 and the dividing region 51 excluding the portion of the gate pad 60. The gate pad 60 is formed separately from the source pad. The dividing region 51 divides the cell region 50 in the expanding direction of stacking fault band 70 at the center of the cell region 50.

Figure 2:
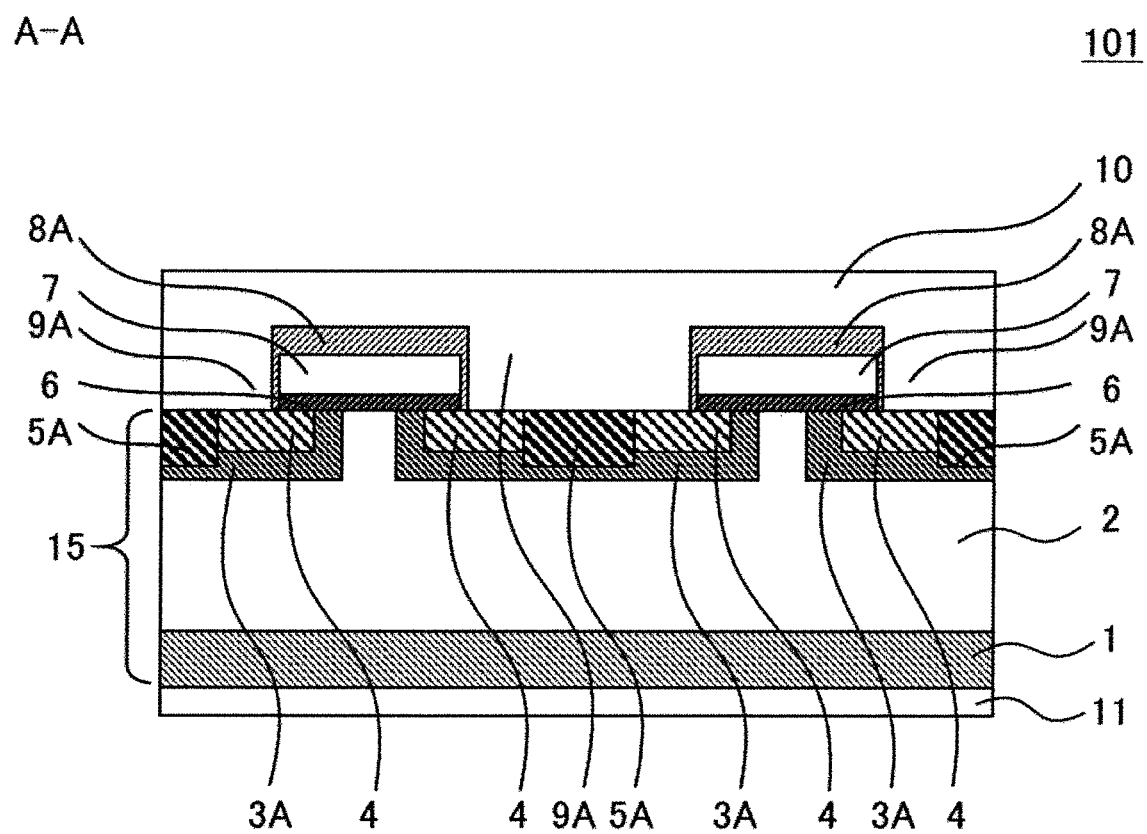
FIG. 2 is a cross-sectional view illustrating a schematic configuration of the semiconductor device according to the first embodiment.

FIG. 2 is a cross-sectional view illustrating a structure of the semiconductor device 101 according to the first embodiment, and corresponds to a cross-section taken along line A-A being a part of cell region 50 in FIG. 4 described later. The semiconductor device 101 includes semiconductor layer 15. In the cell region 50, the semiconductor layer 15 includes a drain region 1 being a semiconductor substrate of a first conductivity type, a drift region 2 of a first conductivity type, provided on the drain region 1 and having a lower impurity concentration than that of the drain region 1, and first well regions 3A of a second conductivity type provided in the upper portions of the drift region 2.

The semiconductor layer 15 includes source regions 4 of the first conductivity type provided in portions of the upper portions of the first well regions 3A and first well contact regions 5A of the second conductivity type provided in other portions of the upper portions of the first well regions 3A. The impurity concentration of the source region 4 is higher than that of the drift region 2, and the impurity concentration of the first well contact region 5A is higher than that of the first well region 3A.

The semiconductor device 101 includes gate insulating films 6 each of which is provided from the upper portion of the source region 4 in the first well region 3A to the upper portion of the other source region 4 and gate electrodes 7 each of which is provided so as to be opposite to the first well regions 3A via the gate insulating film 6. The semiconductor device 101 includes a first interlayer insulating film 8A which is thicker than the gate insulating film 6 and covers the gate insulating film 6 and the gate electrode 7, and a source electrode 10 provided on the upper portions of first interlayer insulating films 8A and electrically connected to the source regions 4 and first well contact regions 5A via first contact holes 9A formed in the first interlayer insulating films 8A. The source electrode 10 is electrically connected to the first well regions 3A via the first well contact regions 5A. The semiconductor device 101 further includes a drain electrode 11 provided on the drain region 1 on the side opposite to the drift region 2.

The operation of the MOSFET provided with the cell region 50 will be described where n-type represents the first conductivity type and p-type represents the second conductivity type. When a voltage equal to or higher than a certain threshold with respect to the source electrode 10 is applied to the gate electrode 7, an n-type channel region is formed on the surface of the first well region 3A located below the gate electrode 7, establishing electrical connection between the source region 4 and the drift region 2. This is the On-state of the semiconductor device 101 where and current flows from the drain electrode 11 to the source electrode 10 via the channel region. This current is the main current in the cell region 50. When a voltage lower than the threshold with respect to the source electrode 10 is applied to the gate electrode 7, the channel region disappears and the MOSFET is turned to the Off-state. The drain electrode 11 and the source electrode 10 are electrically interrupted.

Figure 3:
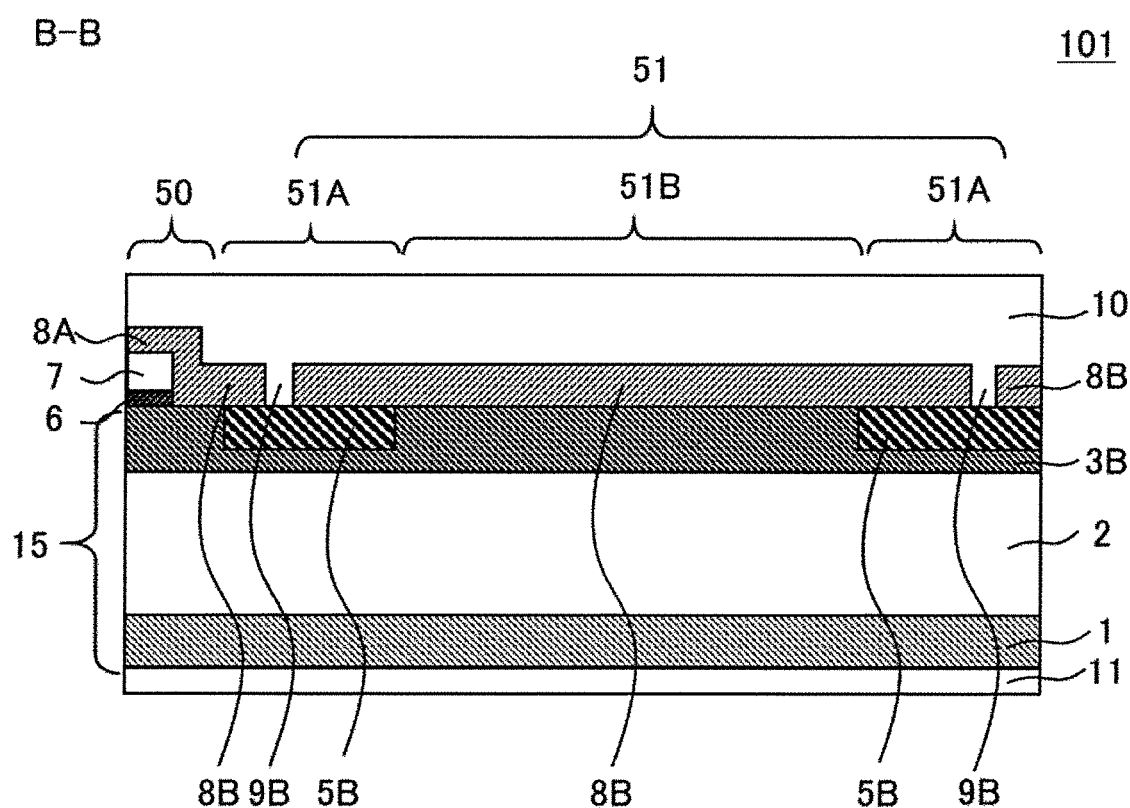
FIG. 3 is a cross-sectional view illustrating a schematic configuration of the semiconductor device according to the first embodiment.

FIG. 3 is a cross-sectional view illustrating a structure of the semiconductor device 101 according to the first embodiment, and corresponds to a cross-section taken along line B-B including the dividing region 51 in FIG. 4 described later. The semiconductor layer 15 includes a second well region 3B provided on the drift region 2 and continuous with the first well region 3A in the dividing region 51. The semiconductor device 101 includes a second interlayer insulating film 8B thicker than gate insulating film 6 on the second well region 3B. The second interlayer insulating film 8B is continuous with the first interlayer insulating film 8A at part not illustrated. Accordingly, the first interlayer insulating film 8A and the second interlayer insulating film 8B are composed of an integral interlayer insulating film, and the first interlayer insulating film 8A and the second interlayer insulating film 8B have the same thickness. The source electrode 10 is formed continuously from the cell region 50 on the second interlayer insulating film 8B. In addition, the source region 4 and the gate electrode 7 are not formed in the dividing region 51.

The dividing region 51 has two boundary regions 51A and a current limiting region 51B interposed therebetween. In each boundary region 51A, a second contact hole 9B is formed in the second interlayer insulating film 8B, and a second well contact region 5B is formed in the upper portion of the second well region 3B. The second well region 3B and the second well contact region 5B are electrically connected to the source electrode 10 via the second contact hole 9B. That is, the two second contact holes 9B are aligned in the expanding direction of stacking fault band. The current limiting region 51B is a region in which no contact hole and well contact region for electrically connecting the source electrode 10 and the second well region 3B are not formed. The second well region 3B is formed on the surface of the semiconductor layer 15 and is in contact with the second interlayer insulating film 8B. The second well region 3B is formed as one region continuous in the expanding direction of stacking fault band in the region interposed between the two second contact holes 9B in top view. Therefore, the drift region 2 is not formed on the surface of the semiconductor layer 15 in the dividing region 51. A transistor is not formed in the dividing region 51 in such a configuration. Therefore, the main current does not flow in the dividing region 51.

Figure 4:
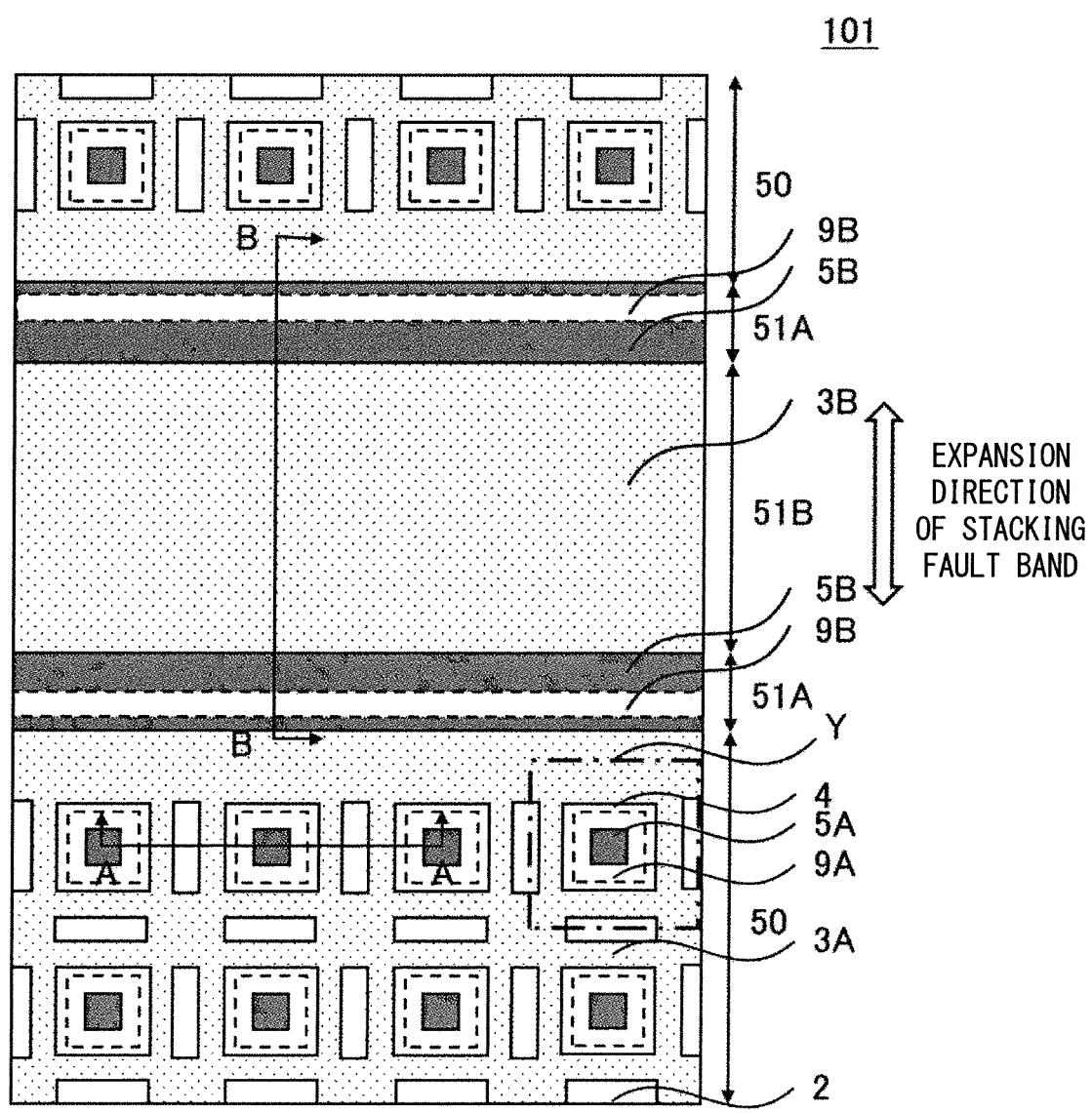
FIG. 4 is a plan view illustrating a schematic configuration of the semiconductor device according to the first embodiment.
Figure 5:
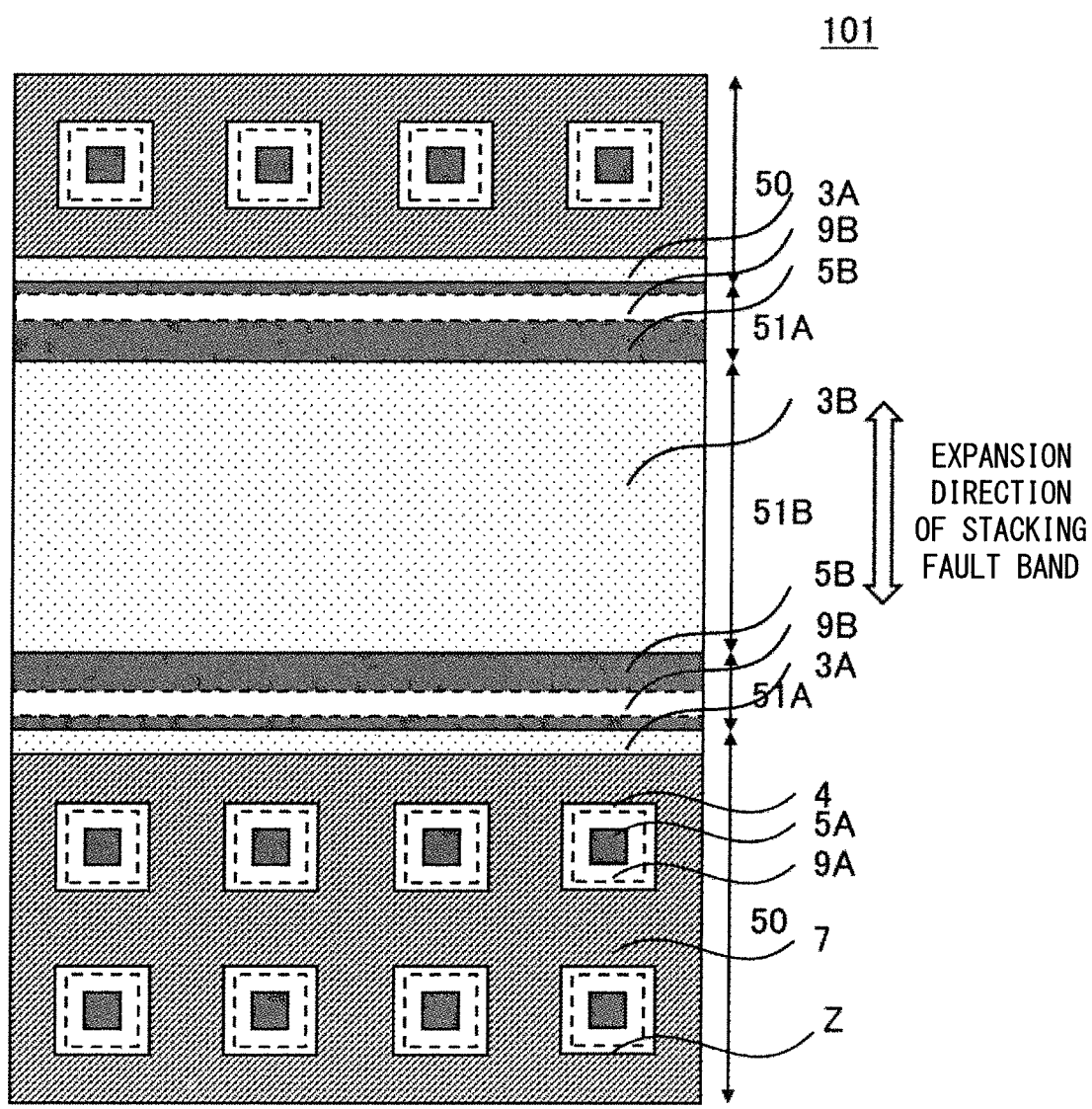
FIG. 5 is a plan view illustrating a schematic configuration of the semiconductor device according to the first embodiment.

FIG. 4 is a plan view illustrating impurity-implanted regions of the cell region 50 and the dividing region 51, and illustrating the surface of the semiconductor layer 15 where the gate insulating film 6, the gate electrode 7, the first interlayer insulating film 8A, the second interlayer insulating film 8B, and the source electrode 10 are removed from the semiconductor device 101. FIG. 5 is a diagram in which the gate electrode 7 is arranged in FIG. 4, and is a plan view in which the gate electrode 7 is added to the impurity-implanted regions of the cell region 50 and the dividing region 51. FIGS. 4 and 5 correspond to enlarged views of the region indicated as the portion X indicated by the one-dot chain line in FIG. 1.

As illustrated in FIG. 4, unit cells (portions Y indicated by one-dot chain lines) are laid out in a matrix in each of two divided cell regions 50 where each unit cell includes the whole source region 4, the whole first well contact region 5A, part of the first well region 3A, and part of the drift region 2. For example, the plurality of unit cells Y are arranged in a grid pattern in the expanding direction of stacking fault band 70 and in the direction orthogonal to the expanding direction. The first well contact region 5A is surrounded by the source region 4. The first contact hole 9A (indicated by a dotted line) is provided in the source region 4 and connected to the source region 4 and the first well contact region 5A. The source region 4 is surrounded by the first well region 3A. A plurality of regions, each of which is composed of the source region 4 and the first well contact region 5A, are arranged in a grid pattern apart from each other on the surface of the first well region 3A. The three first well regions 3A illustrated in FIG. 2 are formed in a manner that they are connected to each other as one well region 3. Each part of the drift region 2 is provided between two adjacent source regions 4 and surrounded by the first well region 3A.

The boundary regions 51A expanding in a direction orthogonal to the expanding direction of stacking fault band 70 in top view are provided at both ends of the dividing region 51 in the expanding direction of stacking fault band 70. The current limiting region 51B is interposed between the two boundary regions 51A and expands in the direction orthogonal to the expanding direction of stacking fault band 70. The two second well contact regions 5B are provided separately in the second well region 3B and arranged in the two boundary regions 51A, respectively. The two second well contact regions 5B may be separated within the second well region, or may be connected at parts not illustrated. The two second contact holes 9B (indicated by dotted lines) formed as single hole, respectively, are provided in the second interlayer insulating film 8B, and are connected to the second well contact regions 5B, respectively. The distance between the two second contact holes 9B is longer than one side of the unit cell Y. The second well region 3B is formed in the current limiting region 51B so as to be interposed between the two second well contact regions 5B.

The first well regions 3A and the second well region 3B are formed continuously within the drift region 2. However, the first well region 3A and the second well region 3B may be separated at the boundary between the cell region 50 and the dividing region 51 in the drift region 2.

As illustrated in FIG. 5, the gate electrode 7 is formed of polysilicon, for example, and is arranged so as to partially overlap parts of the first well regions 3A and the source regions 4. The gate electrode 7 is provided with a plurality of openings Z each of which corresponds to the unit cell Y and opens for the other part of the source region 4 and the first well contact region 5A of each unit cell Y.

Although not illustrated, an interlayer insulating film (made of silicon oxide, for example) having the first contact holes 9A and the second contact holes 9B is provided on the main surface of the semiconductor device 101 illustrated in FIG. 5. The interlayer insulating film becomes the first interlayer insulating film 8A and the second interlayer insulating film 8B. Aluminum wiring (a wiring layer made of aluminum) is further provided on the interlayer insulating film. The aluminum wiring constitutes the source electrode 10, gate wiring and the gate pad 60. The gate wiring is connected to the gate pad 60 and electrically connected to the gate electrode 7. The source electrode 10 is separated from the gate pad 60 and the gate wiring, and the surface thereof serves as a source pad.

The drain region 1, the drift region 2, the first well region 3A, the second well region 3B, the source regions 4, the first well contact regions 5A and the second well contact regions 5B are is composed of a semiconductor material having a wider bandgap than silicon. That is, a semiconductor material with a wider bandgap than silicon is used for the path of the main current. Silicon carbide (including silicon carbide to which impurities are added) is given as a semiconductor material having a wider bandgap than silicon. As a semiconductor substrate, a so-called off-angled silicon carbide semiconductor substrate is used, in which a plane inclined several degrees from the (0001) plane in the <11-20> direction serves as a main surface.

The drift region 2 is formed on the main surface of the silicon carbide semiconductor substrate by epitaxial expansion. Impurities are implanted into the main surface of the drift region 2 using the known lithography technology and ion implantation technology to form the first well region 3A, the second well region 3B, the source regions 4, the first well contact regions 5A and the second well contact region 5B. The first well region 3A and the second well region 3B are formed at the same time; therefore, they have the same depth and the same concentration distribution. The first well contact regions 5A and the second well contact regions 5B are formed at the same time, they have the same depth and the same concentration distribution.

Figure 6:
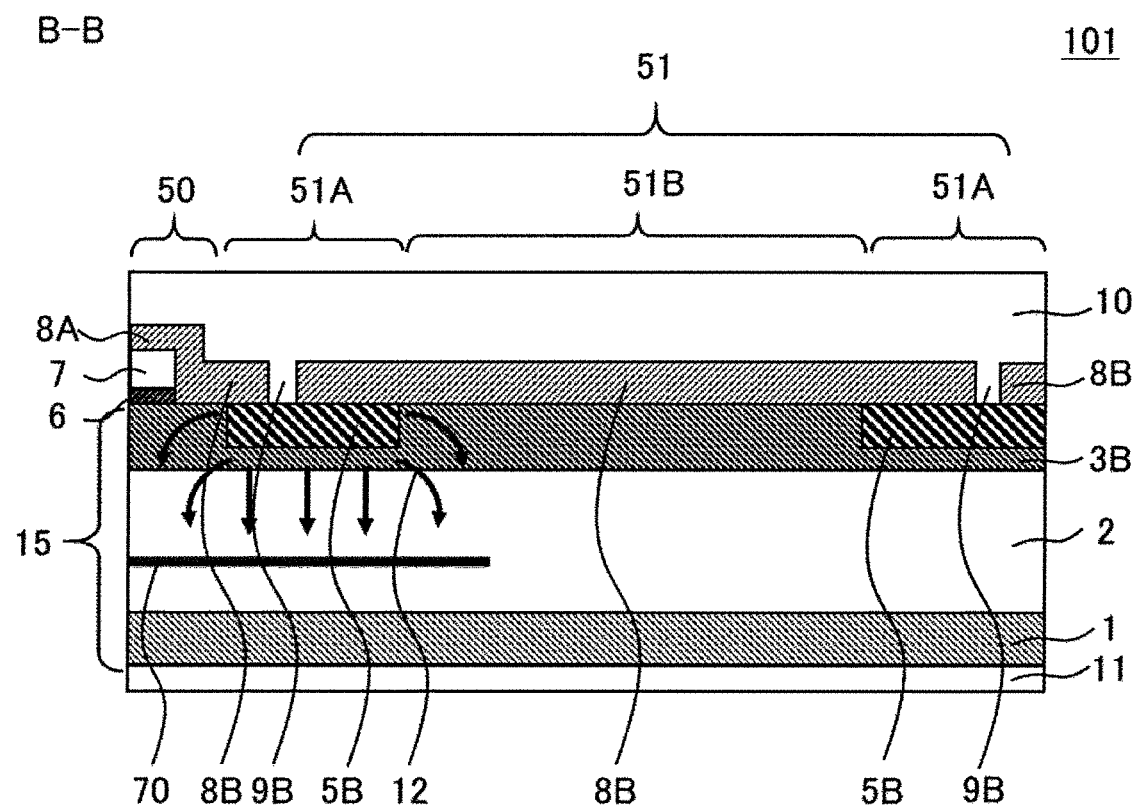
FIG. 6 is a cross-sectional view illustrating a schematic configuration of the semiconductor device according to the first embodiment.

FIG. 6 is a cross-sectional view of the semiconductor device 101 according to the first embodiment. The arrows illustrated in the drawing indicate the directions of the current flowing through a body diode.

The operation when a forward current flows through the body diode in the cell region 50 and the dividing region 51 will be described. Here, the case where n-type represents the first conductivity type and p-type represents the second conductivity type will be described.

The MOSFET includes a body diode in which a p-type well contact region (the first well contact region 5A and the second well contact region 5B), a p-type well region (the first well region 3A and the second well region 3B), and an n-type drift region 2 are provided between the source and drain.

In the cell region 50, minority carriers are implanted into each impurity region of the body diode when a high voltage with respect to the drain electrode 11 is applied to the source electrode 10. In particular, the recombination energy generated when minority carriers (electrons) implanted into the n-type drift layer 2 recombine with majority carriers (electron holes) expands the basal plane dislocation presenting at least any of the drain region 1 and the drift region 2 and generates the stacking fault band 70.

In a semiconductor device using silicon carbide, the direction in which a stacking fault band expands in top view is fixed, and the expansion direction is the crystal orientation [–1100] or [1-100]. Therefore, the "expansion direction of stacking fault band" means the most likely direction toward which a stacking fault band expands in top view, regardless of whether any stacking fault band actually occurs. In the case of the semiconductor device 101, the "expansion direction of stacking fault band" can be rephrased as the direction of crystal orientation [–1100] or [1-100]. In FIG. 6, for example, assuming the leftward direction is [–1100], the rightward direction is [1-100].

In the boundary region 51A, the source electrode 10 and the second well region 3B are electrically connected via the second contact hole 9B, and a stacking fault band 70 occurs in the same way as in the cell region 50 for this reason.

A contact hole is not formed in the current limiting region 51B; therefore, substantially no minority carriers are implanted into the drift region 2. Therefore, in addition to the basal plane dislocations present in the drain region 1 and the drift region 2 not expanding and the stacking fault bands 70 not occurring, the expansion of the stacking fault bands 70 occurring in the cell region 50 or the boundary region 51A is suppressed.

In the dividing region 51, the boundary regions 51A and the current limiting region 51B are electrically connected by the second well region 3B. Although the resistance of the second well region 3B is high, this allows a small amount of minority carriers to be implanted from the second well region 3B into the drift region 2 in the current limiting region 51B, and the stacking fault bands 70 are partially expanded. Therefore, in order to suppress the expansion of a stacking fault band 70, the wider width in the current limiting region 51B is preferable. On the other hand, the current limiting region 51B is a region through which no main current flows; therefore, if the width of the current limiting region 51B is too wide, the area of the cell region 50 through which current flows is reduced, leading to the degradation of the chip performance. In order to secure chip performance while completely suppressing the spread of minority carriers from the boundary regions 51A, the width of the current limiting region 51B in the expanding direction of stacking fault band 70 is preferably 40 μm or more and 500 μm or less.

In this manner, in the semiconductor device 101 of the first embodiment, a forward current is prevented from flowing through the body diode by having a structure where no second contact hole 9B is provided in the current limiting region 51B, and the expansion of stacking fault band 70 is stopped by the formation where dividing occurs in the expansion direction of stacking fault band 70 when the stacking fault band 70, which occurs in at least any of the cell region 50 and the boundary regions 51A, reaches the current limiting region 51B. As a result, the suppression of the expansion of stacking fault band 70 is ensured by the current limiting region 51B.

In addition, in the dividing region 51, the second well region 3B is formed of one region continuous in the expanding direction of stacking fault band in the region interposed between the two second contact holes in top view; therefore, corners due to the semiconductor region of the second conductivity type do not occur. As a result, electric field concentration becomes less likely to occur at the corners of the dividing region 51, and a significant decrease in breakdown voltage can be prevented.

In addition, the dividing region 51 divides the cell region 50 at the center of the cell region 50 in the expanding direction of stacking fault band 70, so that the area of the stacking fault band 70 occurred in the cell region 50 or the boundary region 51A is reduced to at least half or less. As a result, the prevention of an increase in the portion where a current is hampered in the cell region 50 and the reduction an increase in On-resistance in the cell region 50 are ensured.

In addition, the second well region 3B is formed on the entire surface immediately below the second interlayer insulating film 8B in the dividing region 51, and is electrically connected to the source electrode 10, so that the second well region 3B can have approximately the same potential as the source electrode 10 at switching off in the semiconductor device 101 even when a high voltage is applied to between the source and drain. As a result, in comparison with the case where the drift region is exposed on the surface of the semiconductor layer and the interlayer insulating film is formed on the drift region as in Japanese Patent Application Laid-Open No. 2013-232574, the potential immediately below the second interlayer insulating film 8B is fixed and dielectric breakdown of the second interlayer insulating film 8B is prevented.

In addition, the second well contact regions 5B are electrically connected to the source electrode 10 via the second contact holes 9B in the boundary region 51A; therefore, a displacement current preferentially flows from the second well contact regions 5B to the source electrode 10 at the high-speed switching operation where switching between the On-state and the Off-state in the semiconductor device 101 is high speed. As a result, in comparison with the case where the source electrode 10 is directly connected to the second well region 3B without providing the second well contact regions 5B, the displacement current can be efficiently collected, and the potential difference due to the displacement current immediately below the dividing region 51 is reduced, which suppresses dielectric breakdown of the second interlayer insulating film 8B.

Figure 7:
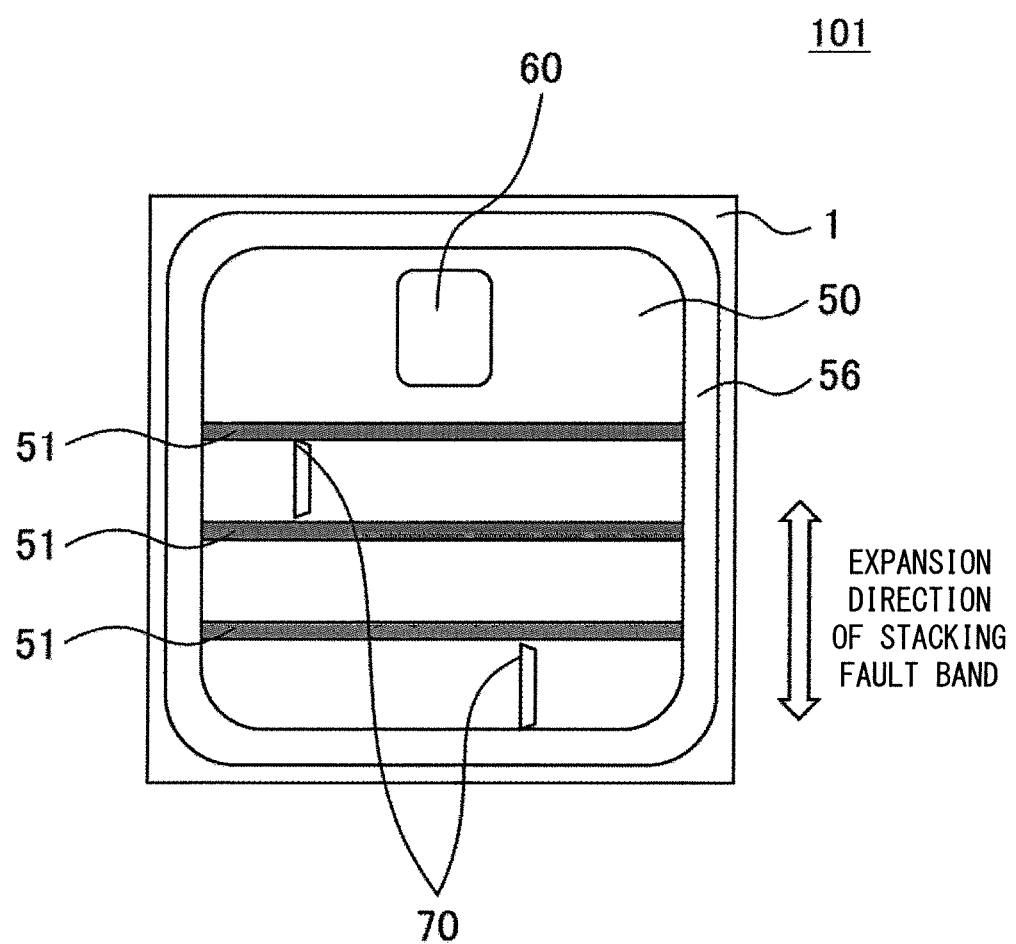
FIG. 7 is a plan view illustrating a modification example of a schematic configuration of the semiconductor device according to the first embodiment.

Note that, although the example has been described in which the dividing region 51 is arranged in the center of the cell region 50 and the cell region 50 is divided into two regions in the expanding direction of stacking fault band 70, the cell region 50 may be divided into three or more regions by arranging two or more dividing regions 51 as illustrated in FIG. 7. By increasing the number of the dividing regions 51 to two or more, the expansion of the stacking fault band 70 is suppressed and the area of the stacking fault band 70 is reduced as compared with the case where the dividing region 51 is provided at one place. As a result, an increase in On-resistance in the cell region 50 can be further reduced.

Also, although the second well contact regions 5B are of the same conductivity type as the second well region 3B, a different conductivity type may also be adopted if the impurity concentration is higher than that of the second well region 3B depending on the switching speed of the semiconductor device 101. As switching becomes faster, the displacement current is more likely to flow through the source electrode 10 via the junction capacitance between the second well contact regions 5B and the second well region 3B. Further, when the second well contact regions 5B are n-type, the effect thereof is enhanced due to its resistance which is lower than when they are p-type.

Second Embodiment

Figure 8:
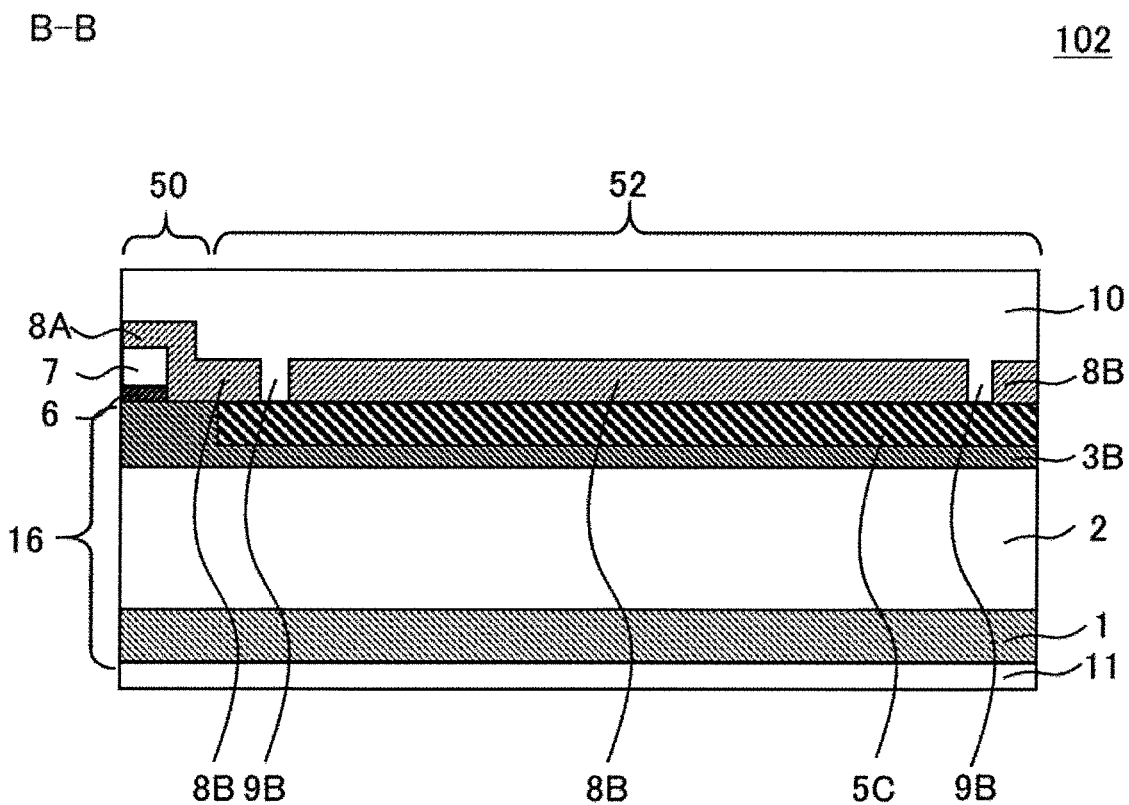
FIG. 8 is a cross-sectional view illustrating a schematic configuration of a semiconductor device according to a second embodiment.

FIG. 8 is a cross-sectional view illustrating a structure of a semiconductor device 102 according to a second embodiment, and corresponds to a cross-section taken along line B-B in FIG. 9 described later.

Although the configuration in which the second well contact regions 5B are formed in the boundary regions 51A have been described in the first embodiment, a second well contact region 5C is formed in the dividing region 52 in the second embodiment, which is the difference from the first embodiment. The rest of the configuration is the same as in the first embodiment, and the same reference numerals are given to the same or corresponding parts as in the first embodiment.

A semiconductor layer 16 includes the second well contact region 5C provided above the second well region 3B instead of the second well contact regions 5B in the dividing region 52, and the rest of the configuration is the same as that of the semiconductor layer 15. The second well contact region 5C is provided entirely over the dividing region 52. That is, the second well contact region 5C is formed as one region continuous in the expanding direction of stacking fault band in the region interposed between the two second contact holes 9B in top view. Therefore, the second well regions 3B is not formed on the surface of the semiconductor layer 16 in the dividing region 52. The second interlayer insulating film 8B thicker than the gate insulating film 6 is formed on the second well contact region 5C. The two second contact holes 9B are provided in the second interlayer insulating film 8B in the vicinity of the boundary with the cell region 50 in the dividing region 52.

Figure 9:
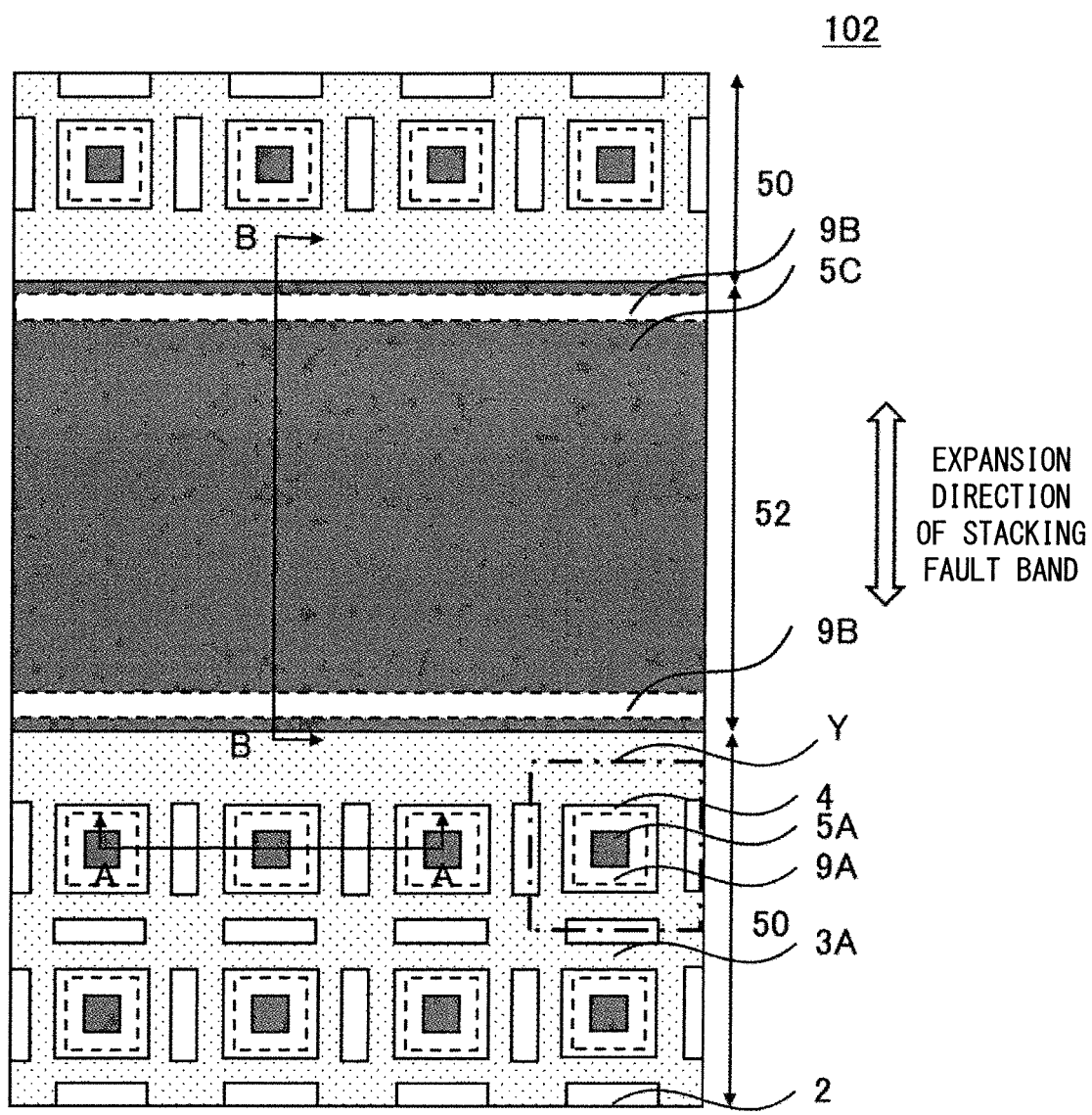
FIG. 9 is a plan view illustrating a schematic configuration of the semiconductor device according to the second embodiment.

FIG. 9 is a plan view illustrating impurity-implanted regions of the cell region 50 and the dividing region 52.

The second well contact region 5C is provided entirely over the dividing region 52. The second contact hole 9B formed as a single hole expanding in a direction orthogonal to the expanding direction of stacking fault band is provided in the vicinity of each boundary between the dividing region 52 and the two cell regions 50, and is connected to the second well contact region 5C. Accordingly, the second well regions 3B and the second well contact region 5C are electrically connected to the source electrode 10 through the two second contact holes 9B.

The operation when a forward current flows through the body diode in the cell region 52 will be described.

In the vicinities of the boundary region 52 with the cell regions 50, the source electrode 10 and the second well region 3B are electrically connected via the second contact holes 9B; therefore, and a stacking fault band 70 occurs in the same way as in the cell regions 50.

In a region where the second contact holes 9B of the dividing region 52 are not formed, although no second contact holes 9B are formed, the second well contact region 5C is formed throughout the dividing region 52, the source electrode 10 and the second well region 3B are electrically connected. However, the forward current flowing through the body diode flows directly under and around the second contact holes 9B in the second well contact region 5C. In addition, even if the second well contact region 5C is formed, the forward current is reduced in the region where the second contact holes 9B of the dividing region 52 are not formed, and minority carriers are less implanted into the drift region 2 as the stacking fault band expands. No minority carriers are injected into the drift region 2 in the center and the periphery of the dividing region 52 in the expanding direction of stacking fault band. Therefore, in addition to the basal plane dislocations present in at least any of the drain region 1 and the drift region 2 not expanding and the stacking fault bands 70 not occurring, the expansion of the stacking fault bands 70 occurring directly under the second contact holes 9B is suppressed.

In order to completely suppress the expansion of stacking fault band 70 and secure the density of the main current (ratio of the area of the cell region 50 to the whole chip) to the expand that the chip performance does not deteriorate, the desired distance between the two arranged second contact holes 9B is to be set to 40 μm or more and 500 μm or less.

Although the second well contact regions 5C are of the same conductivity type as the second well region 3B, a different conductivity type may also be adopted if the impurity concentration is higher than that of the second well region 3B depending on the switching speed of the semiconductor device 102.

Accordingly, in the semiconductor device 102 of the second embodiment, in addition to the effects of the first embodiment, the second well contact region 5C is formed on the surface of the semiconductor layer 16 in the entire dividing region 52; therefore, in comparison with the first embodiment in which the second well contact region 5B is formed in part of the dividing region 51, the displacement current can be efficiently collected at the high-speed switching operation, and the potential difference due to the displacement current immediately below the dividing region 52 is reduced, which suppresses dielectric breakdown of the second interlayer insulating film 8B.

Third Embodiment

Figure 10:
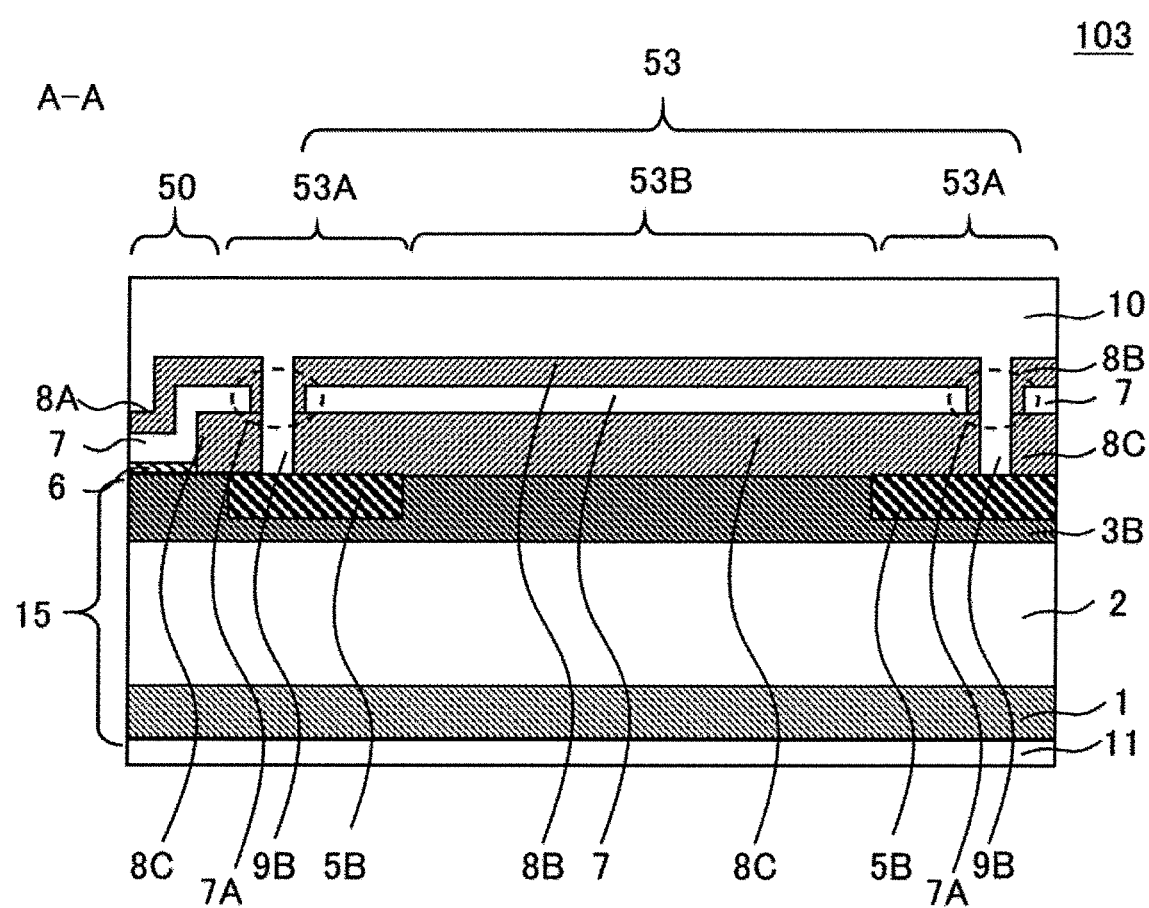
FIG. 10 is a cross-sectional view illustrating a schematic configuration of a semiconductor device according to a third embodiment.

FIG. 10 is a cross-sectional view illustrating a structure of a semiconductor device 103 according to a third embodiment, and corresponds to a cross-section taken along line A-A in FIG. 11 described later.

In the first embodiment, while the configuration in which the second interlayer insulating film 8B and the source electrode 10 are formed on the second well region 3B in the dividing region 51 has been described, the third embodiment is different from the first embodiment in that, in addition to the configuration of the first embodiment, a gate electrode 7 covered with the second interlayer insulating film 8B is formed on the second well region 3B, and a third interlayer insulating film 8C is provided between the gate electrode 7 and the second well region 3B and the second well contact region 5B. The rest of the configuration is the same as in the first embodiment, and the same reference numerals are given to the same or corresponding parts as in the first embodiment.

The third interlayer insulating film 8C thicker than the gate insulating film 6 is formed on the second well region 3B and the second well contact region 5B in a dividing region 53. The gate electrode 7 is also formed continuously from the cell region 50 on the third interlayer insulating film 8C. The second interlayer insulating film 8B is formed so as to cover the gate electrode 7. Therefore, the configuration is adopted in which the gate electrode 7 is provided in the interlayer insulating film configured with the second interlayer insulating film 8B and the third interlayer insulating film 8C. The source electrode 10 is formed continuously from the cell region 50 on the second interlayer insulating film 8B. In addition, the source regions 4 are not formed in the dividing region 53.

In the boundary region 53A, the second contact holes 9B are formed in the second interlayer insulating film 8B and the third interlayer insulating film 8C, and the second well region 3B and the second well contact region 5B are electrically connected to the source electrode 10 via the second contact hole 9B. The gate electrode 7 has openings 7A for passing the second contact holes 9B.

A current limiting region 53B is a region where no second contact holes 9B are formed, and the second well region 3B is in contact with the third interlayer insulating film 8C over the entire current limiting region 53B. As in the first embodiment, the second well region 3B is interposed between a boundary region 53A at one end of the dividing region 53 and a boundary region 53A at the other end.

In FIG. 10, instead of the second well contact region 5B, the second well contact region 5C of the second embodiment may be provided in the second well region 3B.

Figure 11:
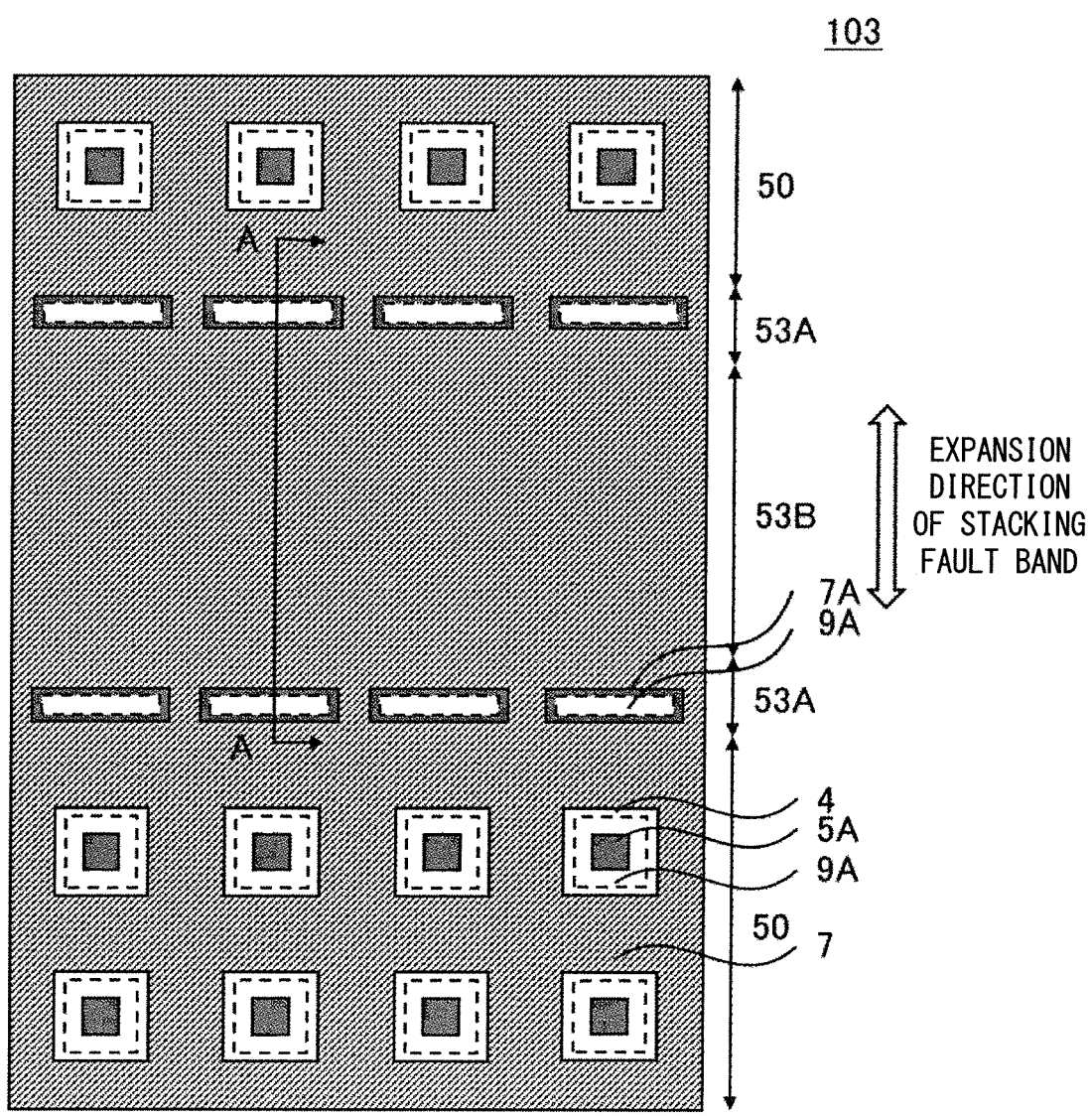
FIG. 11 is a plan view illustrating a schematic configuration of the semiconductor device according to the third embodiment.

FIG. 11 is a plan view in which the gate electrode 7 is added to the impurity-implanted regions of the cell regions 50 and the dividing region 53, and illustrating the main surface of the semiconductor device 103 where the first interlayer insulating film 8A and the second interlayer insulating film 8B are removed from FIG. 10. FIG. 11 corresponds to an enlarged view of the region indicated as the portion X indicated by the one-dot chain line in FIG. 1.

In the dividing region 53, the gate electrode 7 is formed continuously from the cell region 50, and in each of the two boundary regions 53A, the gate electrode 7 is formed with a plurality of openings 7A aligned in the expanding direction of stacking fault band, and a second contact hole 9B is formed in each opening 7A. The reason for the second contact holes 9B being formed with a plurality of holes is to make the potential of the gate electrode 7 common to the cell regions 50 and the dividing region 53.

When viewed from above, the gate electrode 7 surrounds the second contact holes 9B, and the gate electrode 7 formed in the cell regions 50 and the gate electrode 7 formed in the dividing region 53 are formed continuously with each other.

As described above, in the semiconductor device 103 of the third embodiment, in addition to the effect of the first embodiment, the gate electrode 7 is formed in the dividing region 53, making the response of the semiconductor device 103 to the gate drive signal faster in comparison with the case where no gate electrode 7 is formed in the dividing region 53.

Fourth Embodiment

In the third embodiment, the configuration in which the source electrode 10 is provided above the dividing region 53 has been described. A fourth embodiment is different from the third embodiment in that a gate finger (which is the gate wire connected to the gate electrode 7) is provided in a dividing region 54, and in a shape of the source electrode and the position where the gate pad is arranged. The rest of the configuration is the same as in the third embodiment, and the same reference numerals are given to the same or corresponding parts as in the third embodiment.

The semiconductor device 104 according to the fourth embodiment will be described with reference to FIGS. 12 to 14.

Figure 12:
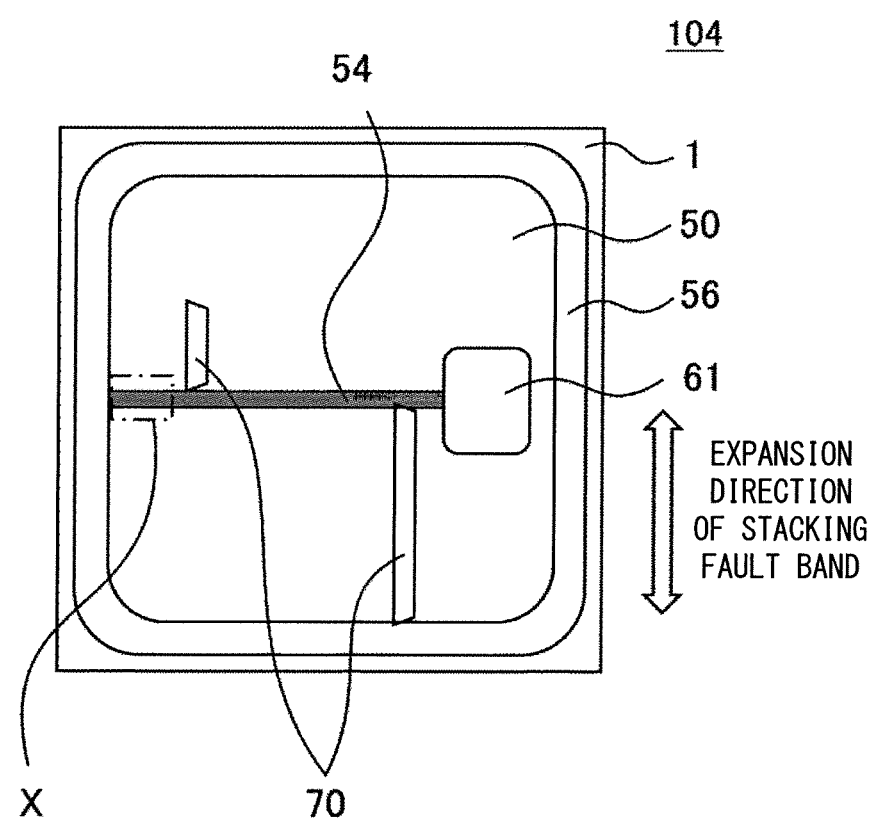
FIG. 12 is a plan view illustrating a schematic configuration of a semiconductor device according to a fourth embodiment.

In the semiconductor device 104 illustrated in FIG. 12, a gate pad 61 is provided so as to divide the cell region 50 in the expanding direction of stacking fault band 70, and the gate finger is formed as the dividing region 54.

Figure 13:
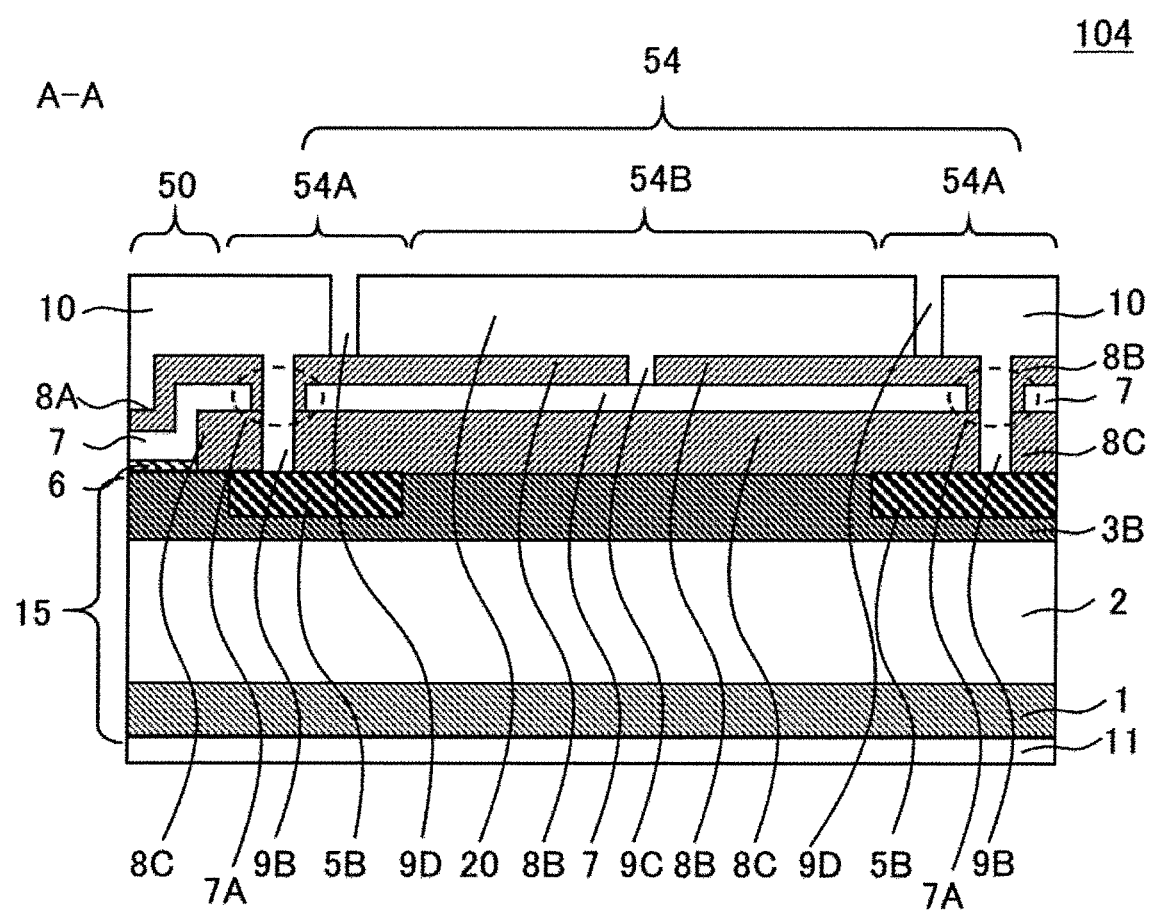
FIG. 13 is a cross-sectional view illustrating a schematic configuration of the semiconductor device according to the fourth embodiment.

FIG. 13 is a cross-sectional view illustrating a structure of the semiconductor device 104 according to the fourth embodiment, and corresponds to a cross-section taken along line A-A in FIG. 14 described later.

In the dividing region 54, a third contact hole 9C for electrically connecting the gate electrode 7 and the gate finger 20 is formed in the second interlayer insulating film 8B located above the gate electrode 7. The gate finger 20 is electrically connected to the gate pad 61 in FIG. 12. An opening 9D is formed in the aluminum wiring for preventing a short circuit between the source electrode 10 and the gate electrode 7.

The second contact holes 9B are provided in the second interlayer insulating film 8B and the third interlayer insulating film 8C, and the source electrode 10 is electrically connected to the second well contact regions 5B through the second contact holes 9B. The gate electrode 7 has openings 7A for passing the second contact holes 9B.

In FIG. 13, instead of the second well contact regions 5B, the second well contact region 5C of the second embodiment may be provided in the second well region 3B.

Figure 14:
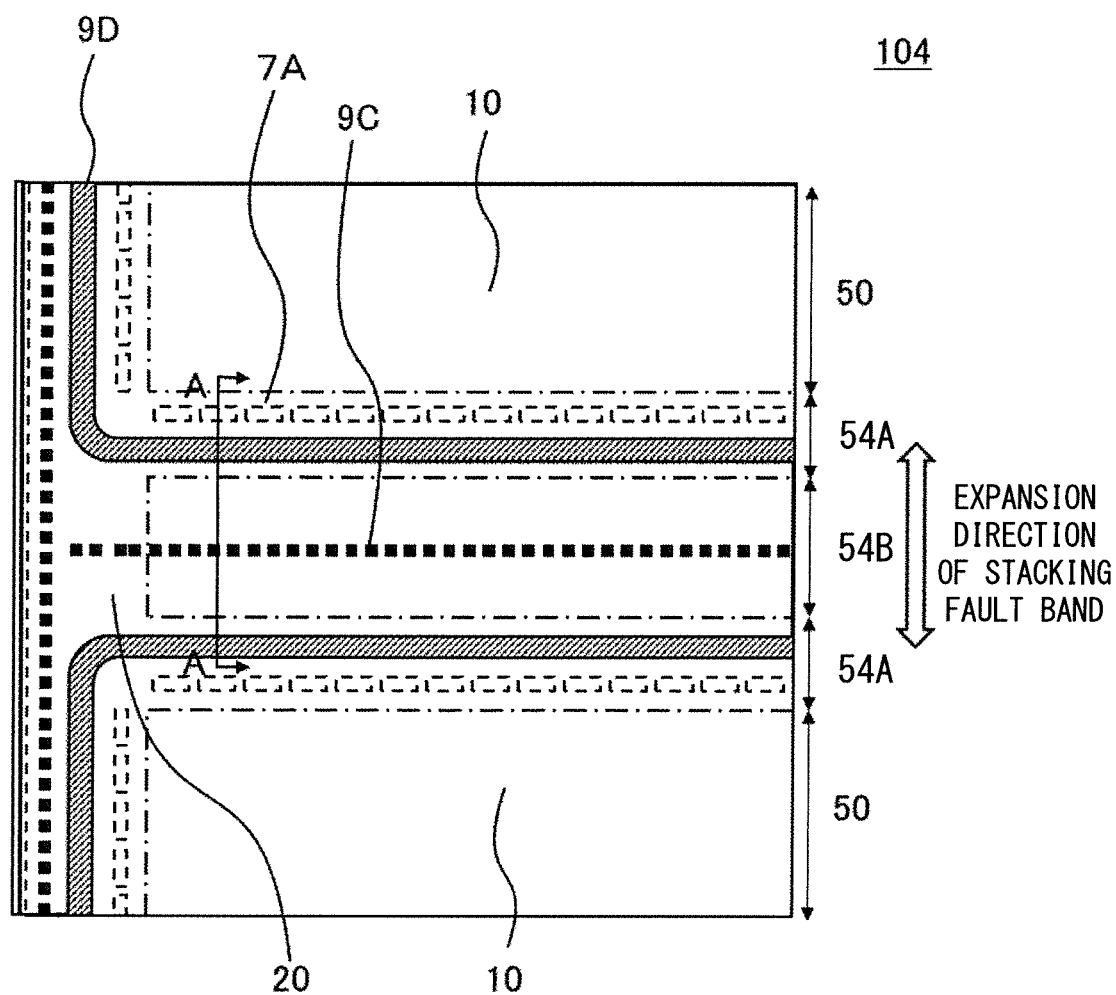
FIG. 14 is a plan view illustrating a schematic configuration of the semiconductor device according to the fourth embodiment.

FIG. 14 is a plan view illustrating the aluminum wiring in the cell region 50 and the dividing region 54 in the fourth embodiment. FIG. 14 corresponds to an enlarged view of the region indicated as the portion X indicated by the one-dot chain line in FIG. 12.

When viewed from above, the gate finger 20 has a first portion located above the current limiting region 54B and a second portion and a third portion respectively expanding from the first portion in regions adjacent to the termination region 56 in both directions of stacking fault band expands. The source electrode 10 is provided on each of the two separated cell regions 50. The shaded part indicates the wiring opening 9D that separates the source electrode 10 and the gate finger 20.

The gate electrode 7 is provided below the gate finger 20 and the source electrodes 10 and is formed over the entire portion illustrated in FIG. 14. A plurality of third contact holes 9C are provided along the pattern shape of the gate finger 20 in the second interlayer insulating film 8B between the gate electrode 7 and the gate finger 20. The gate finger 20 is electrically connected to the gate electrode 7 through the plurality of third contact holes 9C. The gate finger 20 expands rightward in the drawing along the dividing region 54 and is connected to the gate pad 61 at its end.

The gate electrode 7 is provided with a plurality of openings 7A at positions overlapping with the source electrode 10 along the openings 9D. A second contact hole 9B for electrically connecting the source electrode 10 and the second well contact region 5B is provided in each opening 7A.

The one-dot chain line indicates the boundary between the second well contact region 5B and the first well region 3A and the second well region 3B on the surface of the semiconductor layer 15.

In this manner, the semiconductor device 104 of the fourth embodiment has the same effect as that of the first and third embodiments.

Although an example has been described in which the gate pad 61 is provided so as to divide the cell region 50 in the expanding direction of stacking fault band 70, the gate pad 61 may be arranged anywhere on the semiconductor device 104.

Fifth Embodiment

FIG. 15 is a cross-sectional view of a semiconductor device 105 according to a fifth embodiment.

In the third embodiment, the configuration has been described in which the gate electrode 7 covered with the second interlayer insulating film 8B is formed on the second well region 3B. The fifth embodiment is different from the third embodiment in that a single temperature sensing diode is formed instead of the gate electrode 7 in the dividing region 53. The rest of the configuration is the same as in the third embodiment, and the same reference numerals are given to the same or corresponding parts as in the third embodiment.

In a dividing region 55, a single temperature sensing diode composed of an anode layer 13 being a p-type region, and a cathode layer 14 being an n-type region, is formed above the third interlayer insulating film 8C. The anode layer 13 and the cathode layer 14 are connected to an anode electrode (not illustrated) and a cathode electrode (not illustrated) via a fourth contact hole (not illustrated) provided in the second interlayer insulating film 8B.

In FIG. 15, instead of the second well contact regions 5B, the second well contact region 5C of the second embodiment may be provided in the second well region 3B.

Thus, in addition to the effect of the first embodiment, the semiconductor device 105 of the fifth embodiment has the temperature sensing diode formed in the dividing region 55, accurate temperature measurement can be performed by being arranged in the center of semiconductor device 105. In addition, the area efficiency of semiconductor device 105 is improved by installing the temperature sensing diode in the current limiting region 55B.

Although an example has been described in which the temperature sensing diode is provided in the dividing region 55, the temperature sensing diode may be arranged anywhere on the semiconductor device 105.

Also, although an example has been described in which a single temperature sensing diode is provided in the dividing region 55, a plurality of temperature sensing diodes connected in series, in parallel, or a combination thereof may be provided. By connecting a plurality of temperature sensing diodes in series, the temperature change amount of the forward voltage increases in proportion to the number of temperature sensing diodes connected. As a result, the detection sensitivity of temperature change can be improved.

Although in each embodiment, the MOSFET formed in the cell region 50 has a planar gate structure, the MOSFET may have a trench gate structure.

Although in each embodiment, the case has been described where the cell structure of the MOSFET formed in the cell region 50 is a grid pattern, the MOSFET may have a stripe pattern or a hexagonal cell structure.

Figure 16:
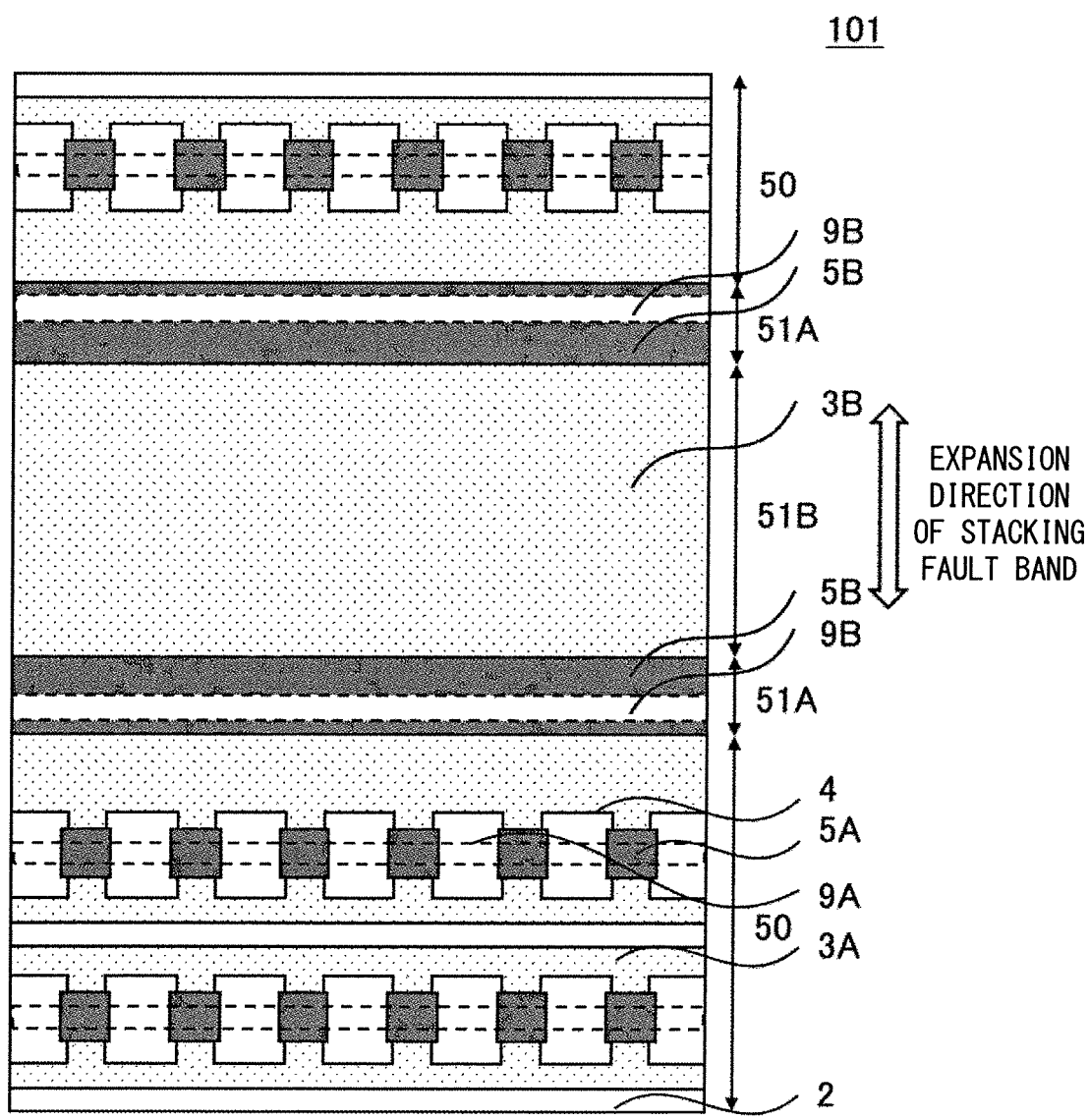
FIG. 16 is a plan view illustrating a modification example of a schematic configuration of the semiconductor device according to the first embodiment.
Figure 17:
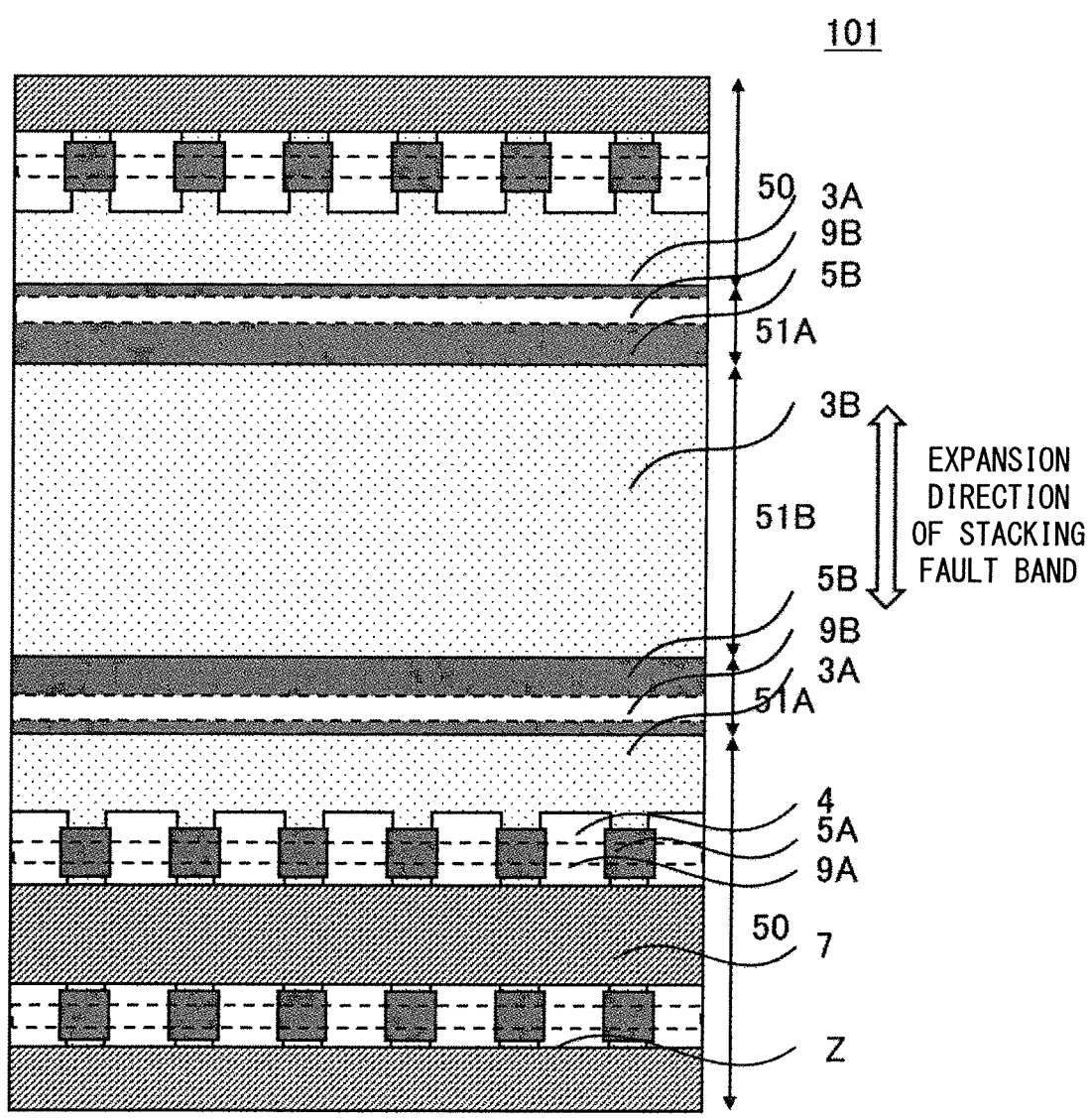
FIG. 17 is a plan view illustrating a modification example of a schematic configuration of the semiconductor device according to the first embodiment.

FIG. 16 is a plan view illustrating impurity-implanted regions of the cell regions 50 and the dividing region 51, for example, in which the cell structure of the semiconductor device 101 of the first embodiment is replaced with a stripe pattern instead of a grid pattern, and illustrating the surface of the semiconductor layer 15 where the gate insulating film 6, the gate electrode 7, the first interlayer insulating film 8A, the second interlayer insulating film 8B, and the source electrode 10 are removed from the semiconductor device 101. FIG. 17 is a diagram in which the gate electrode 7 is arranged in FIG. 16, and is a plan view in which the gate electrode 7 is added to the impurity-implanted regions of the cell regions 50 and the dividing region 51. FIGS. 16 and 17 correspond to enlarged views in the first embodiment of the region indicated as the portion X indicated by the one-dot chain line in FIG. 1.

In the cell region 50, within the first well region 3A of the second conductivity type, the source regions 4 of the first conductivity type and the first well contact regions 5A of the second conductivity type are alternately provided in a column-like structure along the direction orthogonal to the expansion direction of stacking fault band in top view, which structure is a unit cell. A plurality of unit cells are aligned in the expanding direction of stacking fault band with the drift regions 2 of the first conductivity type interposed between adjacent unit cells. The gate electrode 7 expanding in a direction orthogonal to the expanding direction of the stacking fault band is arranged on each drift region 2. An interval between adjacent unit cells corresponds to the distance between the respective centers of the two first well contact regions 5A aligned in the expanding direction of stacking fault band.

Sixth Embodiment

In a sixth embodiment, the semiconductor device according to the above-described first to fifth embodiments is applied to a power conversion apparatus 200. Although the application of the present disclosure is not limited to a specific power conversion apparatus 200, hereinafter, as the sixth embodiment, a case where the present disclosure is applied to a three-phase inverter will be described.

FIG. 18 is a block diagram illustrating a configuration a power conversion system to which a power conversion apparatus 200 of the sixth embodiment is applied.

The power conversion system illustrated in FIG. 18 includes a power supply 100, a power conversion apparatus 200, and a load 300. The power supply 100 is a DC power supply and supplies DC power to the power conversion apparatus 200. The power supply 100 can be configured with various components, for example, the configuration thereof may include a DC system, a solar cell, and a storage battery, or include a rectifier circuit connected to an AC system or an AC/DC converter. Further, the power supply 100 may be configured by a DC/DC converter that converts the DC power output from the DC system into a predetermined power.

The power conversion apparatus 200 is a three-phase inverter connected between the power supply 100 and the load 300, which converts the DC power supplied from the power supply 100 into AC power and supplies AC power to the load 300. As illustrated in FIG. 18, the power conversion apparatus 200 includes a main conversion circuit 201 that converts DC power into AC power and outputs thereof, and a drive circuit 202 that outputs a drive signal for driving each switching element of the main conversion circuit 201, and a control circuit 203 that outputs a control signal for controlling the drive circuit 202 to the drive circuit 202.

The load 300 is a three-phase electric motor driven by AC power supplied from the power conversion apparatus 200. The load 300 is not limited to a specific application, and is an electric motor mounted on various electric devices. For example, the load 300 is used as an electric motor for a hybrid vehicle, an electric vehicle, a railroad vehicle, an elevator, or an air conditioning apparatus.

Hereinafter, the detailed description is made on the power conversion apparatus 200. The main conversion circuit 201 includes a switching element and a freewheeling diode (not illustrated), and by switching the switching element, the DC power supplied from the power supply 100 is converted into AC power and supplied to the load 300. There are various specific circuit configurations of the main conversion circuit 201, and the main conversion circuit 201 according to the sixth embodiment is a two-level three-phase full bridge circuit, and has six switching elements and six freewheeling diodes each of which is anti-parallel with the respective switching elements. For each switching element of the main conversion circuit 201, the semiconductor device according to any one of the first to fifth embodiments described above is applied. Each of the two switching elements connected in series of the six switching elements constitutes an upper and lower arm, and each upper and lower arm constitutes each phase (U-phase, V-phase, W-phase) of the full bridge circuit. Then, the output terminal of each upper and lower arm, that is, the three output terminals of the main conversion circuit 201 are connected to the load 300.

The drive circuit 202 generates a drive signal for driving the switching element of the main conversion circuit 201 and supplies the drive signal to the control electrode of the switching element of the main conversion circuit 201. Specifically, in response to the control signal from the control circuit 203 described later, a drive signal for turning on the switching element and a drive signal for turning off the switching element are output to the control electrode of each switching element. When the switching element is kept in the ON-state, the drive signal is a voltage signal (ON signal) equal to or higher than a threshold voltage of the switching element, and when the switching element is kept in the OFF-state, the drive signal is a voltage signal (OFF signal) equal to or lower than the threshold voltage of the switching element.

The control circuit 203 controls the switching elements of the main conversion circuit 201 so that the desired power is supplied to the load 300. Specifically, the control circuit 203 calculates the time (ON time) for each switching element of the main conversion circuit 201 to be in the ON state based on the power to be supplied to the load 300. For example, the main conversion circuit 201 is controlled by PWM control that modulates the ON time of the switching element according to the voltage to be output. Then, a control command (control signal) is output to the drive circuit 202 so that an ON signal is output to the switching element supposed to be turned on at each time point and an OFF signal is output to the switching element supposed to be turned off. The drive circuit 202 outputs an ON signal or an OFF signal as a drive signal to the control electrode of each switching element according to the control signal.

The semiconductor device according to the first to fifth embodiments is applied as the switching element of the main converter circuit 201 in the power conversion apparatus 200 according to the sixth embodiment, stable operation can be realized.

Although in the sixth embodiment, the example where the present disclosure is applied to the two-level three-phase inverter has been described, the present disclosure is not limited there to, and can be applied to various power conversion apparatuses 200. Although in the sixth embodiment, a two-level power conversion apparatus 200 is adopted, a three-level or multi-level power conversion apparatus 200 may also be adoptable, and when power is supplied to a single-phase load, the present disclosure may also be adopted to a single-phase inverter. Further, when supplying power to a DC load or the like, the present disclosure is adoptable to the DC/DC converter or the AC/DC converter.

Further, the power conversion apparatus 200 to which the present disclosure is applied is not limited to the case where the above-mentioned load is an electric motor, the power conversion apparatus can be applied to the case where a load is a power supply device for an electric discharge machine, a laser machine, an induction heating cooker, or a contactless power supply system, further applied to the case where a load is a power conditioner for a solar power generation system and a power storage systems, for example.

In addition to the above, the embodiments can be combined, components of the embodiments can appropriately be modified, or components of embodiments can appropriately be omitted.

While the disclosure has been illustrated and described in detail, the foregoing description is in all aspects illustrative and not restrictive. It is therefore understood that numerous modifications and variations can be devised without departing from the scope of the invention.

What is claimed is:
1. A semiconductor device using a semiconductor material having a wider bandgap than that of silicon for a main current path, having
a cell region conducting a main current, a dividing region dividing the cell region in an expanding direction of a stacking fault band, and a termination region provided around the cell region, comprising:
a semiconductor layer including
a drain region of a first conductivity type,
a drift region of the first conductivity type arranged on the drain region and having a lower impurity concentration than that of the drain region,
a first well region of a second conductivity type arranged in the cell region and provided in an upper portion of the drift region,
a second well region of the second conductivity type arranged in the dividing region and provided on the drift region,
a source region of the first conductivity type arranged in the cell region and provided in a portion of an upper portion of the first well region, and
a first well contact region of a second conductivity type, arranged in the cell region, provided in a portion of the upper portion of the first well region and adjacent to the source region, and having a higher impurity concentration than that of the first well region;
a gate electrode arranged in the cell region and provided so as to be opposite to the first well region via a gate insulating film;
an interlayer insulating film provided with a first contact hole in the cell region, provided with two second contact holes in the dividing region, and covering the gate electrode and the semiconductor layer;
a source electrode provided on the interlayer insulating film and electrically connecting to the source region and the first well contact region via the first contact hole, and electrically connecting to the second well region via the two second contact holes; and
a drain electrode arranged on the drain region on an opposite side to the drift region, wherein the two second contact holes are aligned in the expanding direction of the stacking fault band, and the second well region is formed as one region continuous in the expanding direction of the stacking fault band in a region interposed between the two second contact holes in top view.

2. The semiconductor device according to claim 1, further comprising a second well contact region arranged in the dividing region, provided in a portion of the upper portion of the second well region, connected to the source electrode via the two second contact holes, and having a higher impurity concentration than that of the second well region.

3. The semiconductor device according to claim 2, wherein a portion of the second well region is interposed between the two second well contact regions in the expanding direction of the stacking fault band, and a width of the portion of the second well region along the expanding direction of the stacking fault band is 40 μm to 500 μm.

4. The semiconductor device according to claim 2, wherein the second well contact region is formed as one region continuous in the expanding direction of the stacking fault band in a region interposed between the two second contact holes in top view.

5. The semiconductor device according to claim 4, wherein a distance between the two second contact holes in the expanding direction of the stacking fault band is 40 μm to 500 μm.

6. The semiconductor device according to claim 1, wherein the first well region and the second well region are composed of continuous layers of the second conductivity type.

7. The semiconductor device according to claim 1, wherein the dividing region divides the cell region at a center of the cell region in the expanding direction of the stacking fault band.

8. The semiconductor device according to claim 1, wherein at least two dividing regions of the dividing region are provided in the cell region.

9. The semiconductor device according to claim 1, wherein the gate electrode is provided also in the interlayer insulating film in the dividing region.

10. The semiconductor device according to claim 9, further comprising gate wiring provided on the interlayer insulating film in the dividing region, wherein the interlayer insulating film includes a third contact hole in the dividing region for electrically connecting the gate wiring and the gate electrode.

11. The semiconductor device according to claim 1, wherein a temperature sensing diode is provided in the interlayer insulating film in the dividing region.

12. The semiconductor device according to claim 1, wherein the semiconductor material is silicon carbide.

13. A power conversion apparatus comprising:

a main conversion circuit including the semiconductor device according to claim 1, and configured to convert and output input power;

a drive circuit configured to output a drive signal for driving the semiconductor device to the semiconductor device; and a control circuit configured to output a control signal for controlling the drive circuit to the drive circuit.

* * * * *